(12) United States Patent
Yamaura

(10) Patent No.: US 11,293,990 B2
(45) Date of Patent: Apr. 5, 2022

(54) SENSOR UNIT

(71) Applicant: DENSO CORPORATION, Kariya (JP)

(72) Inventor: Satoshi Yamaura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/903,775

(22) Filed: Jun. 17, 2020

(65) Prior Publication Data

US 2020/0400748 A1 Dec. 24, 2020

(30) Foreign Application Priority Data

Jun. 20, 2019 (JP) .............................. JP2019-114443

(51) Int. Cl.
| | |
|---|---|
| *G01R 31/382* | (2019.01) |
| *G01R 33/00* | (2006.01) |
| *G01R 31/66* | (2020.01) |
| *H02J 7/00* | (2006.01) |
| *H05K 9/00* | (2006.01) |
| *B60L 58/12* | (2019.01) |
| *H01L 23/50* | (2006.01) |

(52) U.S. Cl.
CPC ............ *G01R 31/382* (2019.01); *B60L 58/12* (2019.02); *G01R 31/66* (2020.01); *G01R 33/0023* (2013.01); *H01L 23/50* (2013.01); *H02J 7/0047* (2013.01); *H05K 9/0022* (2013.01)

(58) Field of Classification Search
CPC .. G01R 31/382; G01R 33/0023; G01R 31/66; G01R 15/207; G01R 33/0041; G01R 33/072; G01R 33/091; G01R 19/0092; G01R 15/20; G01R 15/205; G01R 15/202; G01R 31/364; H02J 7/0047; B60L 58/12; B60L 50/60; B60L 3/0038; H01L 23/50; H01L 25/07; H01L 25/18; H02M 1/00; H02M 1/0009; H02M 50/502; Y02T 10/70

See application file for complete search history.

(56) References Cited

U.S. PATENT DOCUMENTS

| | | | | |
|---|---|---|---|---|
| 6,972,972 | B2 * | 12/2005 | Duncan ................. | H02M 7/003 363/131 |
| 9,494,621 | B2 * | 11/2016 | Yoon ...................... | G01R 15/20 |
| 10,063,038 | B1 * | 8/2018 | Lin .......................... | H02B 1/24 |
| 10,153,634 | B2 * | 12/2018 | Tozawa ................... | H02H 3/05 |
| 10,809,137 | B2 * | 10/2020 | Nakayama .............. | B60L 58/12 |

(Continued)

FOREIGN PATENT DOCUMENTS

| | | |
|---|---|---|
| JP | 2010-002277 A | 1/2010 |
| JP | 6350785 B2 | 7/2018 |

*Primary Examiner* — Helen Rossoshek
(74) *Attorney, Agent, or Firm* — Oliff PLC

(57) ABSTRACT

A sensor unit includes a plurality of bus bars connected to a plurality of switch modules, a terminal block that integrally links the bus bars, and a plurality of magnetoelectric conversion parts that detect currents flowing through the bus bars. Embedded parts of the bus bars embedded in the terminal block are aligned in a first predefined direction with spaces therebetween. The magnetoelectric conversion parts are provided in the terminal block such that they face the embedded parts. Extension parts, extending in the first predefined direction, of any two embedded parts adjacent to each other in a predefined direction adjoin each other in a second predefined direction that intersects the first predefined direction.

4 Claims, 9 Drawing Sheets

(56) References Cited

U.S. PATENT DOCUMENTS

| | | | |
|---|---|---|---|
| 10,932,397 B2* | 2/2021 | Yamahira | H02M 7/53875 |
| 10,962,573 B2* | 3/2021 | Nomura | H02M 1/00 |
| 10,991,989 B2* | 4/2021 | Inoue | H02J 7/00306 |
| 2018/0350515 A1* | 12/2018 | Okamoto | H01F 3/14 |
| 2019/0078943 A1* | 3/2019 | Nakayama | G01K 7/427 |
| 2019/0234996 A1* | 8/2019 | Nomura | G01R 19/0092 |
| 2019/0243328 A1* | 8/2019 | Campbell | B02C 19/0062 |
| 2020/0400721 A1* | 12/2020 | Suzuki | G01R 15/205 |
| 2020/0404804 A1* | 12/2020 | Stoltz | H05K 7/20927 |

* cited by examiner

FIG.2
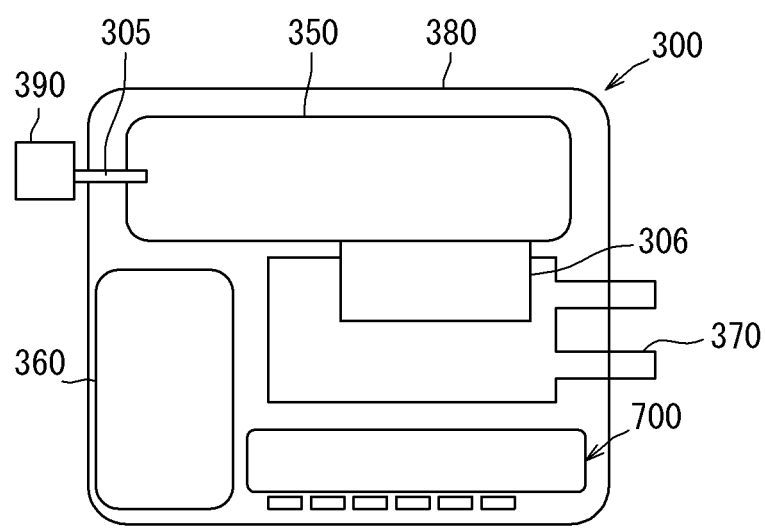
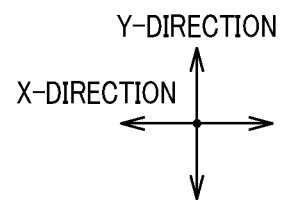

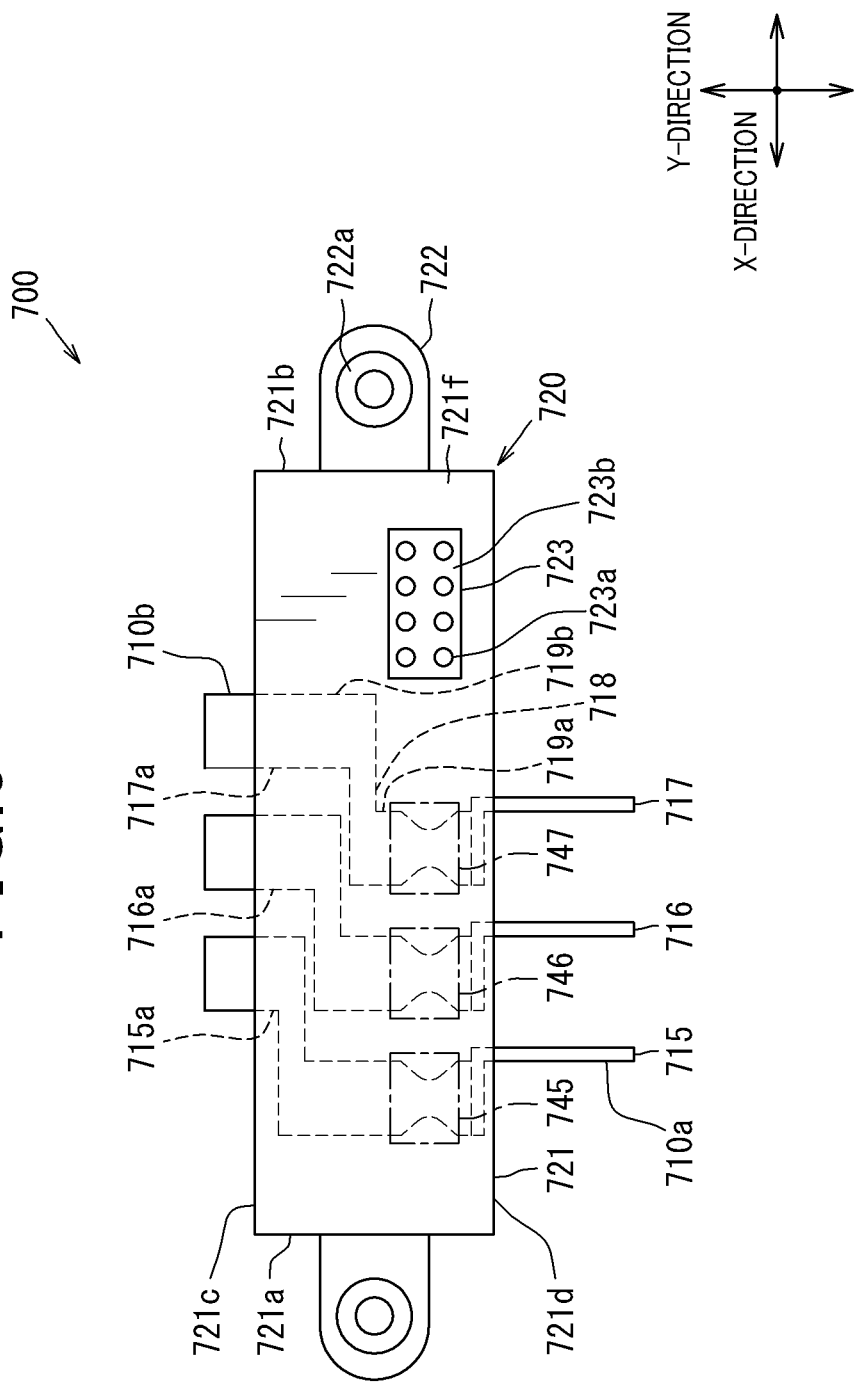

SENSOR UNIT

CROSS-REFERENCE TO RELATED APPLICATION

This application is based on and claims the benefit of priority from earlier Japanese Patent Application No. 2019-114443 filed Jun. 20, 2019, the description of which is incorporated herein by reference.

BACKGROUND

Technical Field

The present disclosure relates to a sensor unit including a bus bar connected to a switch module and a magnetoelectric conversion part configured to detect current flowing through the bus bar.

Related Art

There are known inverter devices including a plurality of bus bars integrally formed with an insulating member, and a plurality of current sensors provided in the insulating member such that they face the bus bars respectively.

BRIEF DESCRIPTION OF THE DRAWINGS

In the accompanying drawings:

FIG. 2 is a schematic diagram of a power converter;
FIG. 9 is a bottom view of the sensor unit of the power converter shown FIG. 7.

DESCRIPTION OF SPECIFIC EMBODIMENT

Figure 1:
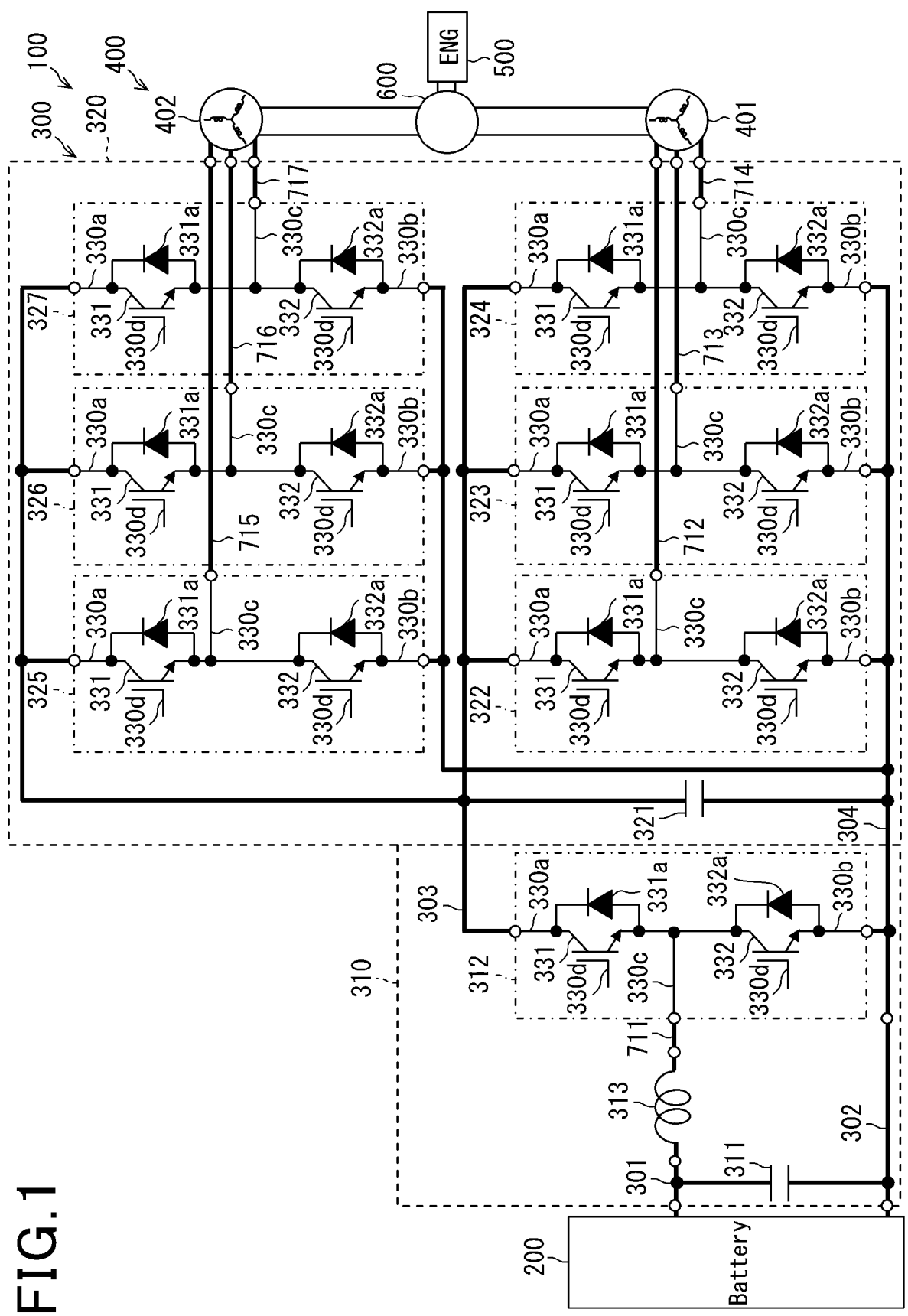
FIG. 1 is a circuit diagram of an on-board vehicle system.

In the known inverter devices, as disclosed in Japanese patent No. 6350785, a plurality of bus bars are integrally formed with the insulating member. Therefore, the positions of the bus bars may be displaced due to vibration or thermal expansion. This may change the relative positional relationship between the current sensors provided in the insulating member and the bus bars. The magnetic field passing through the current sensors may change. The current detection accuracy of the current sensors may deteriorate.

In view of the foregoing, it is desired to have a sensor unit capable of preventing deterioration in the current detection accuracy.

One aspect of the disclosure provides a sensor unit including: a plurality of bus bars individually and respectively connected to a plurality of switch modules forming a part of a power conversion circuit; an insulating resin case configured to integrally link the bus bars such that a part of each bus bar is embedded in the insulating resin case; and a plurality of magnetoelectric conversion parts configured to detect currents flowing through the bus bars by detecting magnetic fields generated by the currents flowing through the bus bars. In the sensor unit, the bus bars have higher rigidity than the resin case. The embedded parts of the bus bars embedded in the resin case are aligned in a first predefined direction with spaces therebetween. The magnetoelectric conversion parts are provided in the resin case such that each magnetoelectric conversion part faces a corresponding one of the embedded parts in a second predefined direction that intersects the first predefined direction. Each embedded part includes an extension part extending in the first predefined direction. The extension parts of any two embedded parts adjacent to each other in the first predefined direction adjoin each other in a third predefined direction that intersects the first predefined direction and the second predefined direction.

According to such configuration, the rigidity of the resin case in the first predefined direction and the third predefined direction is increased. This prevents displacement of the bus bars integrally connected to the resin case in the first predefined direction and the third predefined direction due to vibration or thermal expansion. Changes in the relative positional relationship between the magnetoelectric conversion parts provided in the resin case and the bus bars are prevented. Fluctuations in the measured magnetic field passing through the magnetoelectric conversion parts are suppressed. As a result, it is possible to prevent the current detection accuracy of the magnetoelectric conversion parts from deteriorating.

Further, as compared with the configuration in which the rigidity of the resin case is enhanced by support members that are separate from the bus bars, the number of components can be reduced.

Hereinafter, exemplary embodiments of the present disclosure will be described in detail with reference to the accompanying drawings, in which like reference numerals refer to like or similar elements regardless of reference numerals and duplicated description thereof will be omitted.

First Embodiment

On-Board Vehicle System

First, an on-board vehicle system 100 to which a sensor unit 700 is applied will be described with reference to FIG. 1. The on-board vehicle system 100 constitutes a hybrid system.

The on-board vehicle system 100 includes a battery 200, a power converter 300, and a motor 400. Further, the on-board vehicle system 100 includes an engine 500 and a driving force distribution mechanism 600. The power converter 300 includes the sensor unit 700. The motor 400 has a first MG 401 and a second MG 402. MG is an abbreviation for motor generator.

Further, the on-board vehicle system 100 includes a plurality of electronic control units (ECUs) (not shown). These ECUs exchange signals with each other via bus wiring. The ECUs cooperate with each other to control the hybrid vehicle. The coordinated operation of the ECUs controls the power running (torque generation) and electricity generation (regeneration) of the motor 400 in accordance with the state of charge (SOC) of the battery 200, the output of the engine 500, and the like. SOC is an abbreviation for state of charge. ECU is an abbreviation for electronic control unit.

Each ECU has at least one central processing unit (CPU) and at least one memory device (MMR) as a storage medium for storing programs and data. Each ECU is provided by a microcomputer including a computer-readable storage medium. The storage medium is a non-transitory tangible storage medium that non-temporarily stores computer-readable programs. The storage medium can be provided by a semiconductor memory, a magnetic disk, or the like. The components of the on-board vehicle system 100 will be individually outlined below.

The battery 200 has a plurality of secondary batteries. These secondary batteries are connected in series to form a battery stack. The secondary battery may be a lithium ion secondary battery, a nickel hydrogen secondary battery, an organic radical battery, or the like.

The secondary battery generates electromotive voltage by causing chemical reaction. The secondary battery deteriorates when the charge amount is too large or too small. In other words, when the SOC is overcharged or overdischarged, the deterioration of the secondary battery is promoted.

The SOC of the battery 200 corresponds to the SOC of the above-mentioned battery stack. The SOC of the battery stack is the sum of the SOCs of the secondary batteries. Overcharging or overdischarging of the SOC of the battery stack is avoided by the above-mentioned cooperative control. On the other hand, overcharging or overdischarging of the SOC of each of the secondary batteries is avoided by an equalization process that equalizes the SOCs of the secondary batteries.

The equalization process is performed by individually charging and discharging the secondary batteries. The battery 200 is provided with a monitoring unit including switches for individually charging and discharging the secondary batteries. Further, the battery 200 is provided with components such as a voltage sensor and a temperature sensor to detect the SOC of each secondary battery. A battery ECU, which is one of the plurality of ECUs, controls the opening and closing of the switches based on the outputs of these sensors. This allows the SOCs of the secondary batteries to be equalized. Note that the output of the current sensor 730, which will be described later, is also used to detect the SOCs.

The power converter 300 performs power conversion between the battery 200 and the first MG 401. The power converter 300 also performs power conversion between the battery 200 and the second MG 402. The power converter 300 converts the DC power of the battery 200 into AC power of a voltage level suitable for powering the first MG 401 and the second MG 402. The power converter 300 converts the AC power generated by the first MG 401 and the second MG 402 into DC power of a voltage level suitable to charge the battery 200. The power converter 300 will be described in detail later.

Each of the first MG 401, the second MG 402, and the engine 500 are connected to the driving force distribution mechanism 600. The first MG 401 generates electric power by the rotational energy supplied from the engine 500. The AC power generated by this power generation is converted into DC power by the power converter 300 and is stepped down. This DC power is supplied to the battery 200. The DC power is also supplied to various electric loads mounted on the hybrid vehicle.

The second MG 402 is connected to the output shaft of the hybrid vehicle. The rotational energy of second MG 402 is transmitted to the traveling wheels via the output shaft. Conversely, the rotational energy of the traveling wheels is transmitted to the second MG 402 via the output shaft.

The second MG 402 performs power running using the AC power supplied from the power converter 300. The rotational energy generated by this power running is distributed to the engine 500 and the traveling wheels by the driving force distribution mechanism 600. As a result, the crankshaft is cranked and the propulsive force is applied to the traveling wheels. Further, the second MG 402 performs regeneration using the rotational energy transmitted from the traveling wheels. The AC power generated by this regeneration is converted into DC power by the power converter 300 and is stepped down. This DC power is supplied to the battery 200 and various electric loads.

The rated current of the second MG 402 is larger than that of the first MG 401. A larger amount of current tends to flow in the second MG 402 than in the first MG 401.

The engine 500 burns fuel to generate rotational energy. This rotational energy is distributed to the first MG 401 and the second MG 402 via the driving force distribution mechanism 600. As a result, the electricity generation of the first MG 401 is realized and propulsive force is applied to the traveling wheels.

The driving force distribution mechanism 600 has a planetary gear mechanism. The driving force distribution mechanism 600 includes a sun gear, planetary gears, a planetary carrier, and a ring gear.

The sun gear and planetary gears each have a disk shape. Teeth are formed circumferentially along the circumferential surface of each of the sun gear and the planetary gears.

The planetary carrier has an annular shape. The planetary gears are attached to the flat surface of the planetary carrier such that the flat surfaces of the planetary carrier and the planetary gear face each other.

The planetary gears are located on a circumference around the rotation center of the planetary carrier. The intervals of the planetary gears are the same. In this embodiment, three planetary gears are arranged at 120° intervals.

The ring gear has an annular shape. Teeth are formed circumferentially along the inner and outer circumferential surfaces of the ring gear.

The sun gear is provided at the center of the ring gear. The outer circumferential surface of the sun gear and the inner circumferential surface of the ring gear are opposed to each other. Three planetary gears are provided between them. The teeth of each of the three planetary gears mesh with the teeth of each of the sun gear and the ring gear. This configuration allows the rotations of the sun gear, planetary gears, planetary carrier, and ring gear to be mutually transmitted.

The motor shaft of the first MG 401 is connected to the sun gear. The crankshaft of the engine 500 is connected to the planetary carrier. The motor shaft of the second MG 402 is connected to the ring gear. Thus, the rotational speeds of the first MG 401, the engine 500, and the second MG 402 have a linear relationship in the nomogram.

When AC power is supplied from power converter 300 to the first MG 401 and the second MG 402, torque is produced on the sun gear and the ring gear. The combustion driving of the engine 500 produces torque on the planetary carrier. As a result, the power generation of the first MG 401 and the power running and regeneration of the second MG 402 are realized, and propulsive force is applied to the traveling wheels.

For example, a MGECU, which is one of the ECUs described above, determines the target torque of each of the first MG 401 and the second MG 402 based on physical quantities detected by various sensors mounted on the hybrid vehicle, vehicle information input from other ECUs, and the like. The MGECU performs vector control so that the torque generated in each of the first MG 401 and the second MG 402 meets the target torque. This MGECU is mounted on a control circuit board which will be described later.

Circuit Configuration of Power Converter

Next, the power converter 300 will be described. As shown in FIG. 1, the power converter 300 includes a converter 310 and an inverter 320 as components of the power conversion circuit. The converter 310 is configured to step up and down the voltage level of DC power. The inverter 320 is configured to convert DC power into AC power. The inverter 320 is configured to convert AC power into DC power.

The converter 310 steps up the DC power of the battery 200 to a voltage level suitable for the torque generation of the first MG 401 and the second MG 402. The inverter 320 converts this DC power into AC power. This AC power is supplied to the first MG 401 and the second MG 402. The inverter 320 also converts the AC power generated by the first MG 401 and the second MG 402 into DC power. The converter 310 steps down this DC power to a voltage level suitable for the charging of the battery 200.

As shown in FIG. 1, the converter 310 is electrically connected to the battery 200 via a positive electrode bus bar 301 and a negative electrode bus bar 302. The converter 310 is electrically connected to inverter 320 via a P bus bar 303 and an N bus bar 304.

Converter

The converter 310 includes a filter capacitor 311, an A-phase switch module 312, and an A-phase reactor 313 as electric elements.

As shown in FIG. 1, one end of the positive electrode bus bar 301 is connected to the positive electrode of the battery 200. One end of the negative electrode bus bar 302 is connected to the negative electrode of the battery 200. One of the two electrodes of the filter capacitor 311 is connected to the positive electrode bus bar 301. The other of the two electrodes of the filter capacitor 311 is connected to the negative electrode bus bar 302.

One of the A-phase reactor 313 is connected to the other end of the positive electrode bus bar 301. The other end of the A-phase reactor 313 is connected to the A-phase switch module 312 via a first connecting bus bar 711. Thus, the positive electrode of the battery 200 and the A-phase switch module 312 are electrically connected with each other via the A-phase reactor 313 and the first connecting bus bar 711. In FIG. 1, the connection points of the various bus bars are represented by white circles. These connection points are electrically connected by, for example, bolts or welding.

The A-phase switch module 312 has a high-side switch 331 and a low-side switch 332. The A-phase switch module 312 has a high-side diode 331a and a low-side diode 332a. These semiconductor elements are covered and protected by a sealing resin (not shown).

In this embodiment, an n-channel type IGBT is adopted as the high-side switch 331 and the low-side switch 332. The tips of the terminals respectively connected to the collector electrode, the emitter electrode, and the gate electrode of each of the high-side switch 331 and the low-side switch 332 are exposed to the outside of the sealing resin.

As shown in FIG. 1, the emitter electrode of the high-side switch 331 and the collector electrode of the low-side switch 332 are connected with each other. Thus, the high-side switch 331 and the low-side switch 332 are connected in series.

Further, the cathode electrode of the high-side diode 331a is connected to the collector electrode of the high-side switch 331. The anode electrode of the high-side diode 331a is connected to the emitter electrode of the high-side switch 331. Thus, the high-side switch 331 and the high-side diode 331a are connected in anti-parallel.

Similarly, the cathode electrode of the low-side diode 332a is connected to the collector electrode of the low-side switch 332. The anode electrode of the low-side diode 332a is connected to the emitter electrode of the low-side switch 332. Thus, the low-side switch 332 and the low-side diode 332a are connected in anti-parallel.

As described above, the high-side switch 331 and the low-side switch 332 are covered and protected by the sealing resin. The tips of the terminals connected respectively to the collector electrode and the gate electrode of the high-side switch 331, a point between the high-side switch 331 and the low-side switch 332, and the emitter electrode and the gate electrode of the low-side switch 332 are exposed from this sealing resin. Below, these terminals are referred to as a collector terminal 330a, a midpoint terminal 330c, an emitter terminal 330b, and gate terminals 330d.

The collector terminal 330a is connected to the P bus bar 303. The emitter terminal 330b is connected to the N bus bar 304. Thus, the high-side switch 331 and the low-side switch 332 are connected in serial in this order from the P bus bar 303 to the N bus bar 304.

Further, the midpoint terminal 330c is connected to the first connecting bus bar 711. The first connecting bus bar 711 is electrically connected with the positive electrode of the battery 200 via the A-phase reactor 313 and the positive electrode bus bar 301.

Thus, the DC power of the battery 200 is supplied to the midpoint between the two switches included in the A-phase switch module 312 via the positive electrode bus bar 301, the A-phase reactor 313, and the first connecting bus bar 711. The AC power of the motor 400 converted into DC power by the inverter 320 is supplied to the collector electrode of the high-side switch 331 of the A-phase switch module 312. The AC power of the motor 400 converted into DC power is supplied to the battery 200 via the high-side switch 331, the first connecting bus bar 711, the A-phase reactor 313, and the positive electrode bus bar 301.

Therefore, DC power input into and output from the battery 200 flows through the first connecting bus bar 711. In terms of the physical quantity that flows through, direct current input into and output from the battery 200 flows through the first connection bus bar 711.

The gate terminal 330d of each of the high-side switch 331 and the low-side switch 332 is connected to the above-described gate driver. The MGECU generates a control signal and outputs it to the gate driver. The gate driver amplifies the control signal and outputs it to the gate terminal 330d. The MGECU thereby controls the opening and closing of the high-side switch 331 and the low-side switch 332. As a result, the voltage level of the DC power input to converter 310 is stepped up or down.

The MGECU generates a pulse signal as the control signal. The MGECU adjusts the step-up/down level of the DC power by adjusting the on-duty ratio and frequency of this pulse signal. This step-up/down level is determined according to the target torque of the motor 400 and the SOC of the battery 200.

When the DC power of the battery 200 is to be stepped up, the MGECU alternately opens and closes the high-side switch 331 and the low-side switch 332. When the DC power supplied from the inverter 320 is to be stepped down, the MGECU fixes the control signal output to the low-side switch 332 to low level. At the same time, the MGECU sequentially switches the control signal output to the high-side switch 331 between high level and low level.

Inverter

The inverter 320 includes a smoothing capacitor 321, a discharge resistor (not shown), and a U-phase switch module 322 to a Z-phase switch module 327 as electric elements.

One of the two electrodes of the smoothing capacitor 321 is connected to the P bus bar 303. The other of the two electrodes of the smoothing capacitor 321 is connected to the N bus bar 304. The discharge resistor is also connected to the P bus bar 303 and the N bus bar 304. The U-phase switch module 322 to the Z-phase switch module 327 are also connected to the P bus bar 303 and the N bus bar 304. The smoothing capacitor 321, the discharge resistor, and the U-phase switch module 322 to the Z-phase switch module 327 are connected in parallel between the P bus bar 303 and the N bus bar 304.

Each of the U-phase switch module 322 to the Z-phase switch module 327 has components similar to those of the A-phase switch module 312. That is, each of the U-phase switch module 322 to the Z-phase switch module 327 has a high-side switch 331, a low-side switch 332, a high-side diode 331*a*, a low-side diode 332*a*, and a sealing resin. In addition, each of these six-phase switch modules has a collector terminal 330*a*, an emitter terminal 330*b*, a midpoint terminal 330*c*, and a gate terminal 330*d*.

The collector terminal 330*a* of each of these six-phase switch modules is connected to the P bus bar 303. The emitter terminal 330*b* is connected to the N bus bar 304.

The midpoint terminal 330*c* of the U-phase switch module 322 is connected to the U-phase stator coil of the first MG 401 via a second connecting bus bar 712. The midpoint terminal 330*c* of the V-phase switch module 323 is connected to the V-phase stator coil of the first MG 401 via a third connecting bus bar 713. The midpoint terminal 330*c* of the W-phase switch module 324 is connected to the W-phase stator coil of the first MG 401 via a fourth connecting bus bar 714.

Similarly, the midpoint terminal 330*c* of the X-phase switch module 325 is connected to the X-phase stator coil of the second MG 402 via a fifth connecting bus bar 715. The midpoint terminal 330*c* of the Y-phase switch module 326 is connected to the Y-phase stator coil of the second MG 402 via a sixth connecting bus bar 716. The midpoint terminal 330*c* of the Z-phase switch module 327 is connected to the Z-phase stator coil of the second MG 402 via a seventh connecting bus bar 717.

The gate terminal 330*d* of each of these six-phase switch modules is connected to the above-described gate driver. When the first MG 401 and the second MG 402 are to perform power running, the high-side switches 331 and the low-side switches 332 included in the six-phase switch modules are PWM-controlled by control signals output from the MGECU. As a result, a three-phase alternating current is generated by the inverter 320. When the first MG 401 and the second MG 402 are to generate electric power (perform regeneration), for example, the MGECU stops outputting the control signals. Then, the AC power generated by the power generation passes through the diodes of the six-phase switch modules. As a result, the AC power is converted into DC power.

The AC power input to and output from the first MG 401 and the second MG 402 described above flows through the second connecting bus bar 712 to the seventh connecting bus bar 717 that connect the first MG 401 and the second MG 402 to the inverter 320. In terms of the physical quantity that flows through, AC current that is input to and output from each of the first MG 401 and the second MG 402 flows through the second connecting bus bar 712 to the seventh connection bus bar 717.

Note that the type of the switch elements included in the A-phase switch module 312 and the U-phase switch module 322 to the Z-phase switch module 327 are not particularly limited, and for example, MOSFETs may be used. The semiconductor elements such as switches and diodes included in these switch modules can be manufactured from semiconductors such as Si and wide gap semiconductors such as SiC. The constituent material of the semiconductor elements is not particularly limited.

Mechanical Configuration of Power Converter

Next, the mechanical configuration of the power converter 300 will be described. To this end, hereinafter, three directions which are orthogonal to each other will be referred to as a x-direction, a y-direction, and a z-direction. The x-direction corresponds to the first predefined direction. The y-direction corresponds to the third predefined direction. The z-direction corresponds to the second predefined direction.

In addition to the components of the power conversion circuit described above, the power converter 300 includes a capacitor case 350, a reactor case 360, a cooler 370, a sensor unit 700, an inverter housing 380, and an input/output connector 390 shown in FIG. 2.

In FIG. 2, the positive electrode bus bar 301 and the negative electrode bus bar 302 are collectively shown as an electrode bus bar 305. The ends of these two bus bars are provided in the input/output connector 390. The terminals of a wire harness are connected to the input/output connector 390. The battery 200 and the power converter 300 are electrically connected via this wire harness.

In FIG. 2, the P bus bar 303 and the N bus bar 304 are collectively shown as a PN bus bar 306. These two bus bars are stacked in the z-direction with an insulating sheet interposed between them.

The capacitor case 350 and the reactor case 360 are made of an insulating resin material. The filter capacitor 311 and the smoothing capacitor 321 are placed in the capacitor case 350. The reactor case 360 houses the A-phase reactor 313.

The cooler 370 houses the switch modules included in the converter 310 and the inverter 320. The cooler 370 has a function of cooling the switch modules. A power module is formed by housing the switch modules in the cooler 370.

The sensor unit 700 has a terminal block 720 made of an insulating resin material. A part of each of the first connecting bus bar 711 to the seventh connecting bus bar 717 is insert-molded in this terminal block 720. The terminal block 720 is provided with a current sensor 730 that detects the current flowing through these connecting bus bars. The sensor unit 700 will be described in detail later.

The inverter housing 380 houses the capacitor case 350, the reactor case 360, the cooler 370, the sensor unit 700, and the input/output connector 390. The inverter housing 380 also houses the electrode bus bar 305 and the PN bus bar 306.

Although not shown, the inverter housing 380 is connected to a motor housing that houses the first MG 401 and the second MG 402. A so-called electromechanically integrated type power converter unit is formed by connecting the power converter 300 and the motor 400.

The inverter housing 380 and the motor housing are connected with each other so that they are aligned in the z-direction. A part of the PN bus bar 306 is opposed to the cooler 370 housing the switch modules in the z-direction.

As described above, the cooler 370 houses the seven switch modules included in the converter 310 and the inverter 320. Each switch module has a sealing resin, and the tips of the collector terminal 330a, the emitter terminal 330b, the midpoint terminal 330c, and the gate terminals 330d are exposed from the sealing resin. The collector terminal 330a, the emitter terminal 330b, and the midpoint terminal 330c extend toward the PN bus bar 306 in the z-direction. The gate terminals 330d extend toward the opposite side in the z-direction.

The collector terminal 330a is welded to the P bus bar 303. The emitter terminal 330b is welded to the N bus bar 304. The midpoint terminal 330c is welded to the connecting bus bar included in the sensor unit 700.

Further, although not shown, the inverter housing 380 houses a driver board having the above-described gate driver and a control circuit board on which the MGECU is mounted. The driver board and the control circuit board are aligned with the PN bus bar 306 in the z-direction via the cooler 370. The gate terminals 330d are soldered to the driver board. Output pins 723a, which will be described later, are soldered to the control circuit board.

Sensor Unit

Next, the sensor unit 700 will be described in detail with reference to FIGS. 2 to 6. The sensor unit 700 includes the first connection bus bar 711 to the seventh connection bus bar 717 and the terminal block 720 described above, and the current sensor 730. The sensor unit 700 also includes a shield 740, a resin cover 750, and an opposing shield 760 shown in FIG. 6. The terminal block 720 corresponds to the resin case.

The current sensor 730 includes a first magnetoelectric conversion part 731 to a seventh magnetoelectric conversion part 737 of the magnetic balance type corresponding to the above-mentioned seven connecting bus bars, and a sensor substrate 738 on which these seven magnetoelectric conversion parts are mounted. The shield 740 includes a first shield 741 to a seventh shield 747 made of a metal material having a magnetic permeability that is higher than that of the terminal block 720. The opposing shield 760 includes a first opposing shield 761 to a seventh opposing shield 767 made of a metal material having a magnetic permeability higher than that of the resin cover 750.

The first connecting bus bar 711 to the seventh connecting bus bar 717 are insert-molded in the terminal block 720. The first magnetoelectric conversion part 731 to the seventh magnetoelectric conversion part 737 are provided on the terminal block 720 so that they are opposed to the parts of the seven connecting bus bars that are insert-molded in the terminal block 720 in the z-direction.

The first shield 741 to the seventh shield 747 are insert-molded in the terminal block 720. The first opposing shield 761 to the seventh opposing shield 767 are insert-molded in the resin cover 750. The resin cover 750 is provided on the terminal block 720 such that the seven shields and the seven opposing shields are aligned in the z-direction with a space between them.

The part of one connecting bus bar insert-molded in the terminal block 720 and one magnetoelectric conversion part are located between one of the shields and one of the opposing shields aligned in the z-direction. This suppress external noise from interfering with the magnetoelectric conversion parts. Distribution of the magnetic field (measured magnetic field) generated from the current flowing through the part of the connecting bus bar insert-molded in the terminal block 720 is regulated. Fluctuations in the direction of the measured magnetic field that passes through the magnetoelectric conversion parts are suppressed. The components of the sensor unit 700 will be individually described below.

Connecting Bus Bar

The first connecting bus bar 711 to the seventh connecting bus bar 717 are made of a metal material that has higher rigidity than the terminal block 720, such as copper or aluminum. These seven connecting bus bars are produced by pressing a flat metal plate. The central parts of the seven connecting bus bars are insert-molded in the terminal block 720. Both ends of the seven connecting bus bars are exposed from the terminal block 720.

The midpoint terminal 330c of each switch module is joined to one end 710a of each of the first connecting bus bar 711 to the seventh connecting bus bar 717 exposed from the terminal block 720. The A-phase reactor 313 is joined to the other end 710b of the first connection bus bar 711. An outer bus bar is joined to the other end 710b of each of the second bus bar 712 to the seventh bus bar 717. The outer bus bar is connected to the stator coil of the motor 400 via a wire harness. The motor 400 corresponds to the on-board equipment.

Terminal Block

The terminal block 720 will be described by separating it into smaller segments: a base part 721, flange parts 722, and a connector part 723. The base part 721, the flange parts 722, and the connector part 723 are integrally connected by the resin material forming the terminal block 720.

The base part 721 has a generally rectangular parallelepiped shape whose longitudinal direction is the x-direction. Therefore, the base part 721 has a left face 721a and a right face 721b aligned in the x-direction, a front face 721c and a rear face 721d aligned in the y-direction, and an upper face 721e and a lower face 721f aligned in the z-direction.

As shown in FIGS. 3 to 6, a flange part 722 is integrally connected to each of the left face 721a and the right face 721b of the base part 721. One of these two flange parts 722 protrudes from the left face 721a in the x-direction. The other of the two flange parts 722 protrudes from the right face 721b in the x-direction.

A metal collar 722a is insert-molded in each of the two flange parts 722. The collar 722a has an annular shape whose opening is orthogonal to the z-direction. A bolt is passed through the hollow of the collar 722a. The tip of this bolt is fastened to the inverter housing 380. This allows the sensor unit 700 to be fixed to the inverter housing 380.

Figure 4:
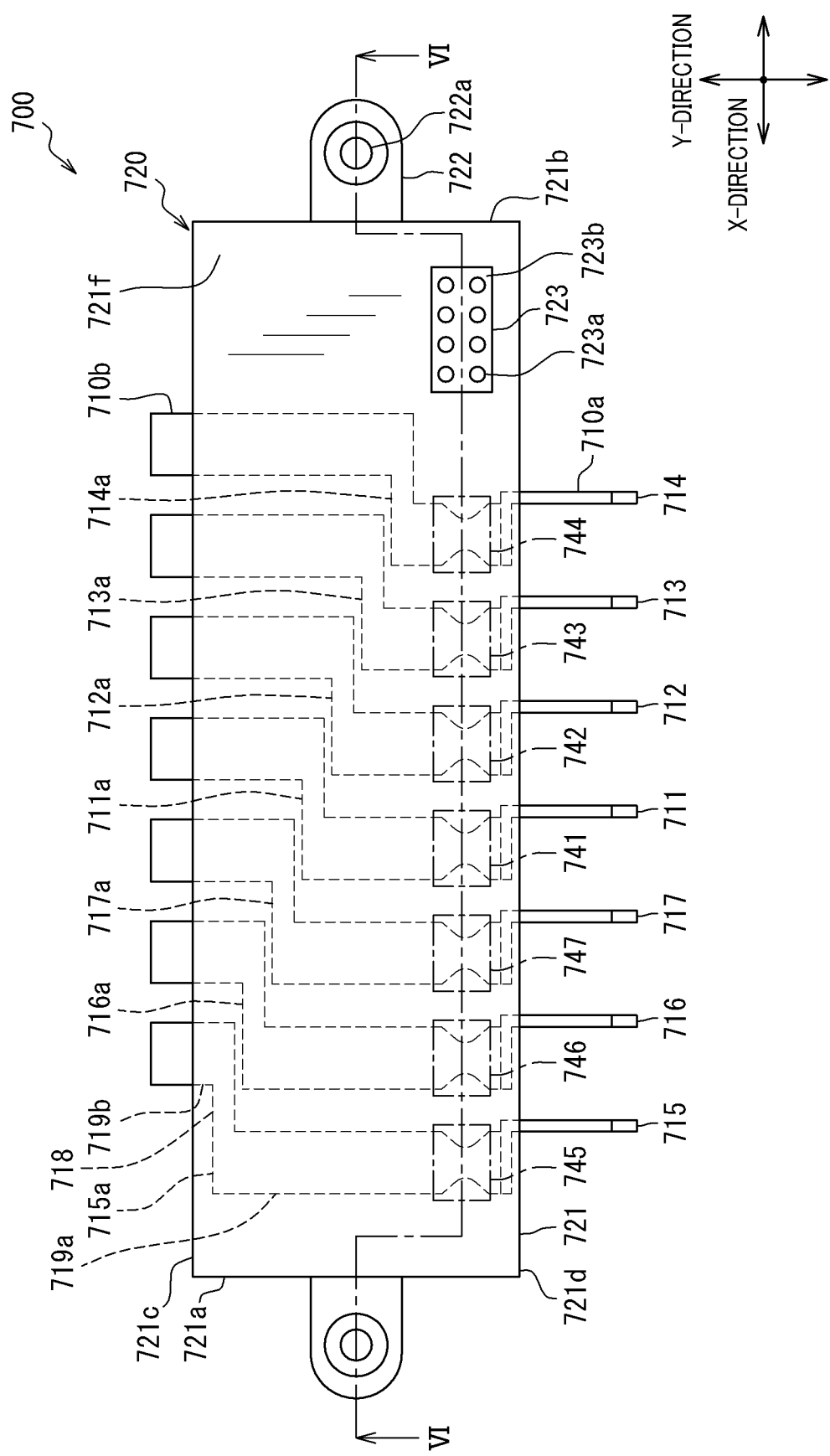
FIG. 4 is a bottom view of the sensor unit.
Figure 5:
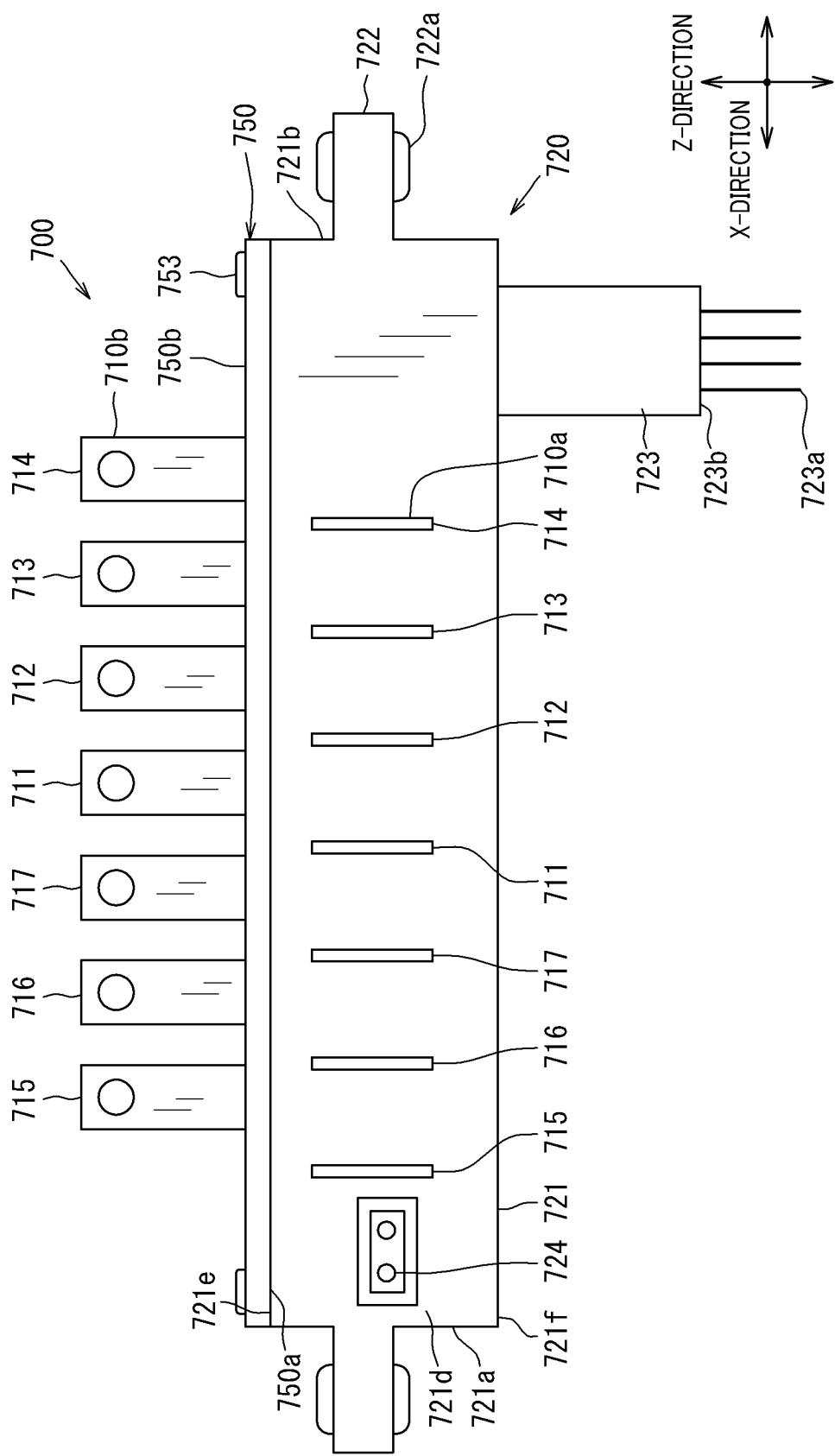
FIG. 5 is a front view of the sensor unit.

As shown in FIGS. 4 to 5, the connector part 723 is integrally connected to the lower face 721f of the base part 721. The connector part 723 extends in the z-direction from the lower face 721f.

A plurality of output pins 723a are insert-molded in the connector part 723. The output pins 723a extend in the z-direction. One end of each output pin 723a is exposed from the end face 723b of the connector part 723. This end of each output pin 723a is soldered to the control circuit board. The other end of each output pin 723a is exposed from the upper face 721e of the base part 721. This other end of each output pin 723a is soldered to the sensor substrate 738.

Figure 3:
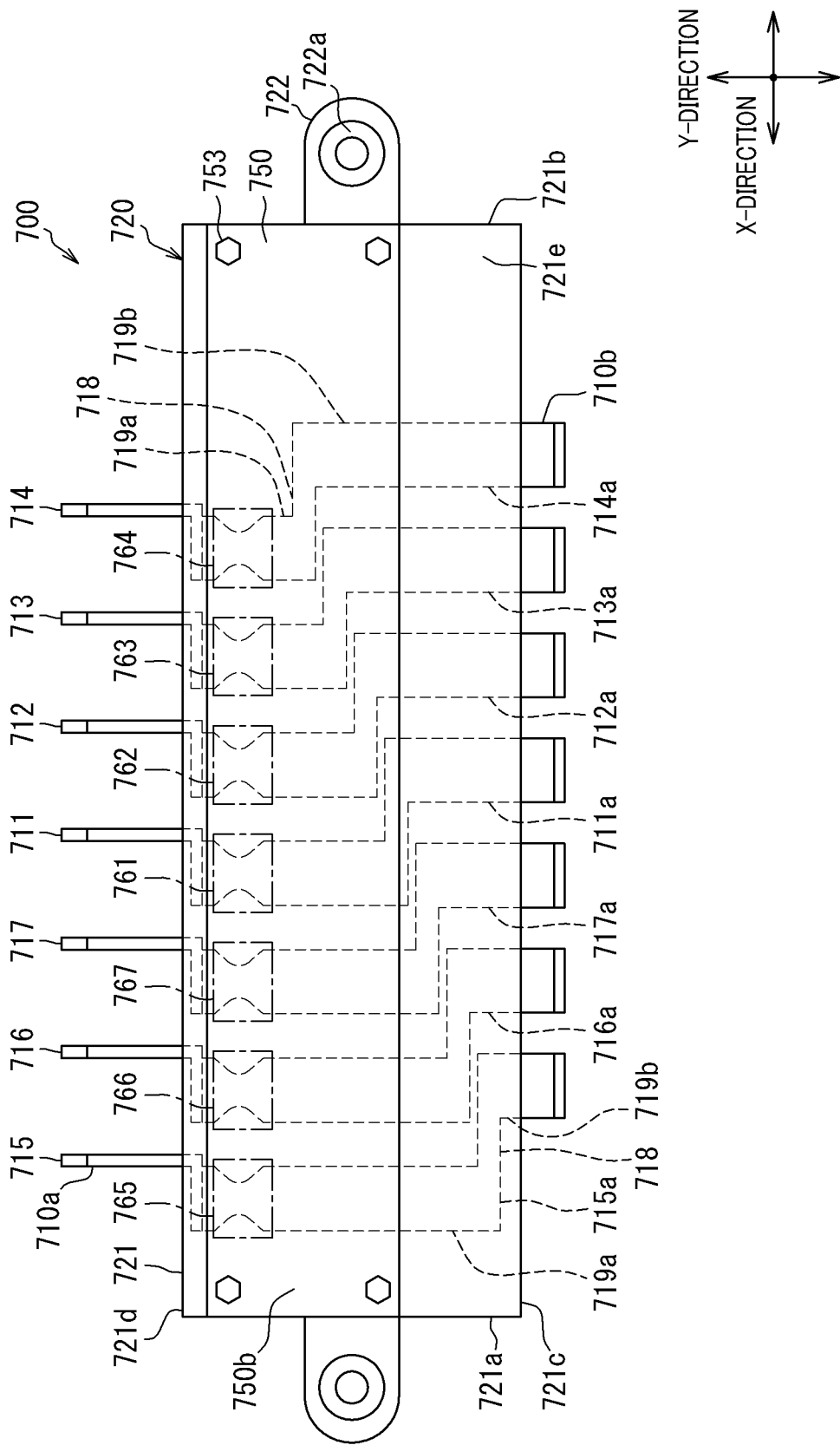
FIG. 3 is a top view of a sensor unit of the power converter.

As shown in FIGS. 3 to 5, the central part of each of the first connecting bus bar 711 to the seventh connecting bus bar 717 is insert-molded in the base part 721. These seven connecting bus bars are arranged side by side in the x-direction with spaces between them. Specifically, from the left face 721a toward the right face 721b, they are arranged in the order of the fifth connecting bus bar 715, the sixth connecting bus bar 716, the seventh connecting bus bar 717, the first connecting bus bar 711, the second connecting bus bar 712, the third connecting bus bar 713, and the fourth connecting bus bar 714.

One end 710a of each of these seven connecting bus bars protrudes from the rear face 721d. The one end 710a has a flat shape with a small thickness in the x-direction. The connecting face of the one end 710a facing the x-direction is put into contact with the midpoint terminal 330c such that they face each other in the x-direction. The one end 710a and the midpoint terminal 330c are irradiated with laser from the z-direction. The connecting bus bar and the midpoint terminal 330c are thereby welded and joined.

The other end 710b of each of these seven connecting bus bars protrudes from the front faces 721c. After extending in the y-direction from the front face 721c, the other end 710b bends and extends in the z-direction from the lower face 721f toward the upper face 721e. The outer bus bar is bolted to the other end 710b. The connecting bus bar and the outer bus bar are thereby bolted and joined. Note that the other end 710b may extend in the z-direction from the upper face 721e toward the lower face 721f.

The central part of each of the first connecting bus bar 711 to the seventh connecting bus bar 717 insert-molded in the base part 721 first extends from the rear face 721d toward the front face 721c, and then extends from the left face 721a toward the right face 721b. After that, the central part extends toward the front face 721c.

In the following, in order to simplify and clarify the description, the parts (center parts) of the first connecting bus bar 711 to the seventh connecting bus bar 717 insert-molded in the terminal block 720 are referred to as a first embedded part 711a to a seventh embedded part 717a as necessary. The part of each of these embedded parts extending from the left face 721a toward the right face 721b is referred to as an extension part 718. The part of the embedded part extending from the extension part toward the rear face 721d is referred to as a first extension part 719a. The part of the embedded part extending from the extension part 718 toward the front face 721c is referred to as a second extension part 719b.

Figure 6:
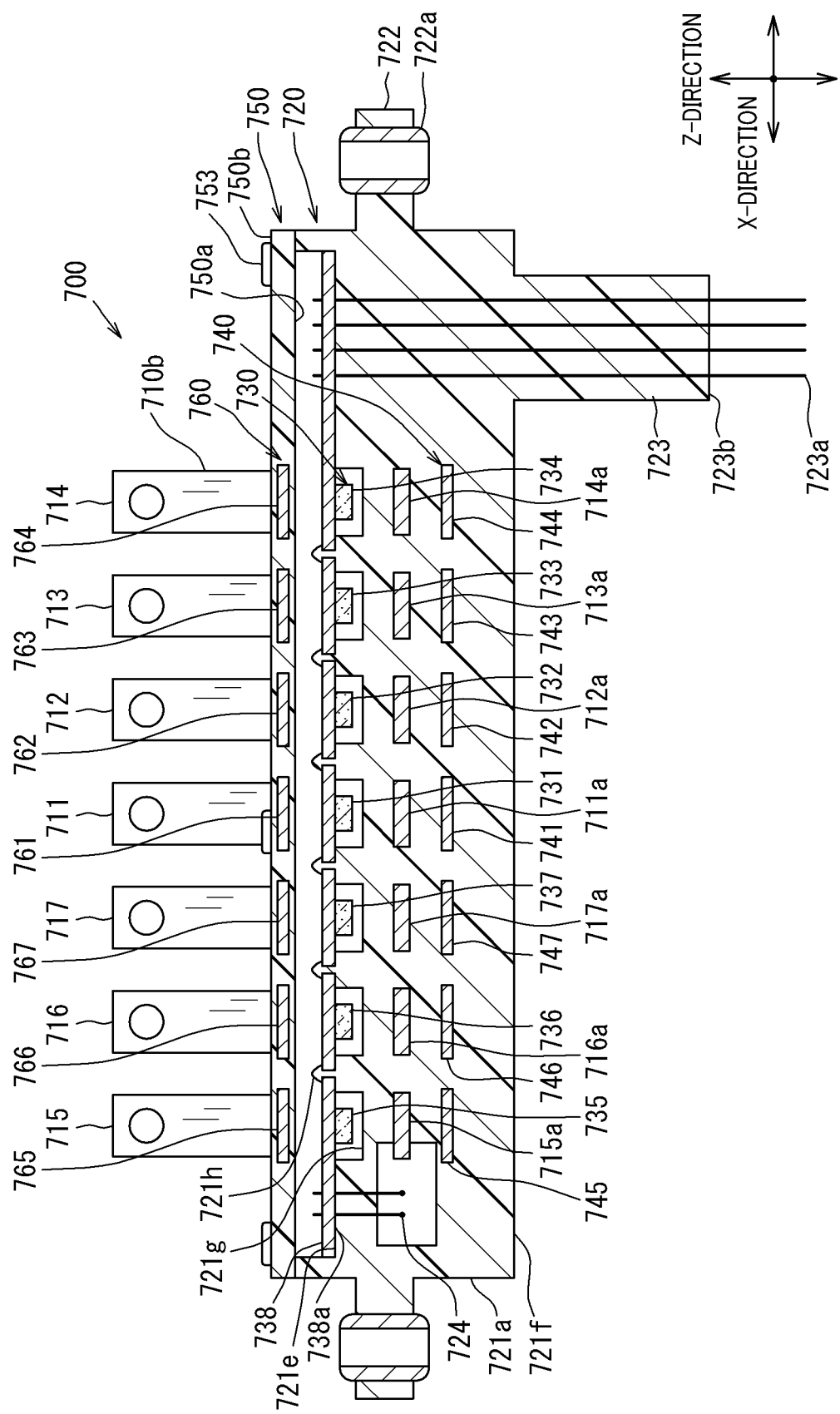
FIG. 6 is a cross-sectional view taken along the line VI-VI shown in FIG. 4.

As shown in FIGS. 5 and 6, an interlock pin 724 is insert-molded in the base part 721. The interlock pin 724 is for determining whether or not a protective cover (not shown) has been attached to the sensor unit 700.

One end of the interlock pin 724 protrudes from the rear face 721d of the base part 721. The connection pin of the protective cover is connected to this end. The other end of the interlock pin 724 protrudes from the upper face 721e of the base part 721. This other end is connected to the sensor substrate 738. A signal indicating the connection state between the interlock pin 724 and the connection pin is input to the MGECU of the control circuit board via the sensor substrate 738 and the output pin 723a as a signal indicating the attachment state of the protective cover and the sensor unit 700.

As shown in FIG. 6, a plurality of recesses 721g locally recessed in the z-direction are formed in the upper face 721e of the base part 721. Seven recesses 721g are formed in the base part 721. These seven recesses 721g are aligned in the x-direction with spaces between them. These seven recesses 721g are positioned so that they face the first embedded part 711a to the seventh embedded part 717a in the z-direction.

The current sensor 730 is provided on the upper face 721e. One of a first magnetoelectric conversion part 731 to a seventh magnetoelectric conversion part 737 is provided in the hollow of each of the above-described seven recesses 721g. A mounting surface 738a of the sensor substrate 738 on which the magnetoelectric conversion parts are mounted is provided on the upper face 721e. The mounting surface 738a faces toward the z-direction.

Between each two adjacent recesses 721g on the upper face 721e having a gap therebetween in the x-direction, a protrusion 721h protruding in the z-direction is formed. The sensor substrate 738 is provided with through holes through which the protrusions 721h pass. After the protrusions 721h are passed through the through holes, their tips will be heat-crimped. Further, the sensor substrate 738 is bolted to the base part 721. Thus, the sensor substrate 738 is fixed to the base part 721. The relative positions of the seven magnetoelectric conversion parts with respect to the corresponding seven connecting bus bars are determined.

Current Sensor

As described above, the current sensor 730 includes the first magnetoelectric conversion part 731 to the seventh magnetoelectric conversion part 737. Each of these seven magnetoelectric conversion parts has a plurality of magnetoresistance elements whose resistance values vary according to the magnetic field that permeates them (permeating magnetic field). The resistance values of this magnetoresistive elements change according to the component of the permeating magnetic field in the direction along the mounting surface 738a. That is, the resistance value of a magnetoresistive element changes according to the component along the x-direction and the component along the y-direction of the permeating magnetic field.

On the other hand, the resistance value of a magnetoresistive element does not change with the permeating magnetic field along the z-direction. Therefore, even if external noise along the z-direction passes through a magnetoresistive element, the resistance value of the magnetoresistive element does not change.

Each magnetoresistive element includes a pinned layer having a fixed magnetization direction, a free layer whose magnetization direction changes in accordance with the permeating magnetic field, and a non-magnetic intermediate layer provided between them. When the intermediate layer is non-conductive, the magnetoresistive element is a giant magnetoresistive element. When the intermediate layer is conductive, the magnetoresistive element is a tunnel magnetoresistive element. The magnetoresistive element may be an anisotropic magnetoresistive element (AMR). Further, the magnetoelectric conversion part may have a Hall element instead of a magnetoresistive element.

The resistance value of the magnetoresistive element changes depending on the angle formed by the magnetization directions of the pinned layer and the free layer. The magnetization direction of the pinned layer is the direction facing the z-direction. The magnetization direction of the free layer is determined by the component of the permeating magnetic field along the direction facing the z-direction. The resistance value of the magnetoresistive element becomes the smallest when the magnetization directions of the free layer and the fixed layer are parallel to each other. The resistance value of the magnetoresistive effect element becomes the largest when the magnetization directions of the free layer and the fixed layer are antiparallel.

Each of the seven magnetoelectric conversion parts has a bridge circuit including a first magnetoresistive element and a second magnetoresistive element having pinned layers with inverted magnetization directions. Further, the seven magnetoelectric conversion parts or the sensor substrate 738 has a differential amplifier, a feedback coil, and a shunt resistor.

The bridge circuit is connected to the inverting input terminal and the non-inverting input terminal of the differential amplifier. The feedback coil and the shunt resistor are connected in series to the output terminal of the differential amplifier. The differential amplifier is virtually short-circuited by a feedback circuit (not shown).

With the connection configuration described above, a current corresponding to the permeating magnetic field flows through the input terminals of the differential amplifier. The differential amplifier operates so that the inverting input terminal and the non-inverting input terminal have the same potential. That is, the differential amplifier operates so that the current flowing through the input terminal and the current flowing through the output terminal become zero. Therefore, a current (feedback current) according to the permeating magnetic field flows from the output terminal of the differential amplifier.

This feedback current flows through the feedback coil and the shunt resistor. This flow of the feedback current produces a canceling magnetic field in the feedback coil. This canceling magnetic field passes through the magnetoelectric conversion part. As a result, the measured magnetic field passing through the magnetoelectric conversion part is canceled. The magnetoelectric conversion part thus operates so that the measured magnetic field passing through itself and the canceling magnetic field are in equilibrium.

A feedback voltage corresponding to the amount of the feedback current that generates the canceling magnetic field is generated at the midpoint between the feedback coil and the shunt resistor. This feedback voltage is input to the MGECU of the control circuit board via the output pin 723a as an electric signal that has detected the current to be measured.

As described above, the first magnetoelectric conversion part 731 to the seventh magnetoelectric conversion part 737 are mounted on the mounting surface 738a of the sensor substrate 738. These seven magnetoelectric conversion parts are aligned in the x-direction with spaces between them. Specifically, they are aligned in the order of the fifth magnetoelectric conversion part 735, the sixth magnetoelectric conversion part 736, the seventh magnetoelectric conversion part 737, the first magnetoelectric conversion part 731, the second magnetoelectric conversion part 732, the third magnetoelectric conversion part 733, and finally the fourth magnetoelectric conversion part 734 from the left face 721a toward the right face 721b.

The fifth magnetoelectric conversion part 735 to the seventh magnetoelectric conversion part 737 are opposed to the first extension parts 719a of the fifth embedded part 715a to the seventh embedded part 717a in the z-direction. Therefore, the magnetic field generated from the alternating current flowing through the second MG 402 passes through the fifth magnetoelectric conversion part 735 to the seventh magnetoelectric conversion part 737. The fifth magnetoelectric conversion part 735 to the seventh magnetoelectric conversion part 737 detect the alternating current flowing through the second MG 402.

The first magnetoelectric conversion part 731 is opposed to the first extension part 719a of the first embedded part 711a in the z-direction. Therefore, the magnetic field generated from the direct current flowing through the converter 310 passes through the first magnetoelectric conversion part 731. The first magnetoelectric conversion part 731 detects the direct current flowing through the converter 310.

The second magnetoelectric conversion part 732 to the fourth magnetoelectric conversion part 734 are opposed to the first extension parts 719a of the second embedded part 712a to the fourth embedded part 714a in the z-direction. Therefore, the magnetic field generated from the alternating current flowing through the first MG 401 passes through the second magnetoelectric conversion part 732 to the fourth magnetoelectric conversion part 734. The second magnetoelectric conversion part 732 to the fourth magnetoelectric conversion part 734 detect the alternating current flowing through the first MG 401.

The alternating currents and the direct current detected by these seven magnetoelectric conversion parts are input to the control circuit board. The MGECU provided on the control circuit board vector-controls the motor 400 based on the detected alternating currents, the rotation angle of the motor 400 detected by a rotation angle sensor (not shown), and the like. In addition, the MGECU outputs the detected direct current to other ECUs such as the battery ECU.

Shield

As described above, the shield 740 includes the first shield 741 to the seventh shield 747. These seven shields have a flat plate shape with a thin thickness in the z-direction. The seven shields are insert-molded in the base part 721 such that they are lined up in the x-direction with gaps between them. The seven shields are positioned so as to face the seven embedded parts in the z-direction. The component of the magnetic field in the direction facing the z-direction tends to pass through the shields.

Resin Cover

The resin cover 750 is made of an insulating resin material. The resin cover 750 has a generally rectangular parallelepiped shape whose longitudinal direction is the x-direction. The resin cover 750 has an inner face 750a and an outer face 750b aligned in the z-direction. The resin cover 750 is provided on the upper face 721e side of the base part 721 such that the inner face 750a faces the sensor substrate 738 in the z-direction.

Nuts are insert-molded in the resin cover 750. The shaft parts of bolts 753 are passed through these nuts. Then, the bolts 753 are fastened to the base part 721.

Opposing Shield

As described above, the opposing shield 760 includes the first opposing shield 761 to the seventh opposing shield 767. These seven opposing shields have a flat plate shape with a thin thickness in the z-direction. The seven opposing shields are insert-molded in the resin cover 750 such that they are lined up in the x-direction with gaps between them. The component of the magnetic field in the direction facing the z-direction tends to pass through the opposing shields.

With the resin cover 750 fixed to the base part 721 by the bolts 753, the seven opposing shields are aligned with the seven shields in the z-direction. The seven embedded parts and the seven magnetoelectric conversion parts are located between the seven opposing shields and the seven shields.

Specifically, in the z-direction, the first extension part 719a of the fifth embedded part 715a and the fifth magnetoelectric conversion part 735 are located between the fifth shield 745 and the fifth opposing shield 765. The first extension part 719a of the sixth embedded part 716a and the sixth magnetoelectric conversion part 736 are located between the sixth shield 746 and the sixth opposing shield 766. The first extension part 719a of the seventh embedded part 717a and the seventh magnetoelectric conversion part 737 are located between the seventh shield 747 and the seventh opposing shield 767.

In the z-direction, the first extension part 719a of the first embedded part 711a and the first magnetoelectric conversion part 731 are located between the first shield 741 and the first opposing shield 761.

In the z-direction, the first extension part 719a of the second embedded part 712a and the second magnetoelectric conversion part 732 are located between the second shield 742 and the second opposing shield 762. The first extension part 719a of the third embedded part 713a and the third magnetoelectric conversion part 733 are located between the third shield 743 and the third opposing shield 763. The first extension part 719a of the fourth embedded part 714a and the fourth magnetoelectric conversion part 734 are located between the fourth shield 744 and the fourth opposing shield 764.

Embedded Part

As described above, the central part of each of the first connecting bus bar 711 to the seventh connecting bus bar 717 is insert-molded in the base part 721. From the left face 721a toward the right face 721b, they are arranged in the order of the fifth connecting bus bar 715, the sixth connecting bus bar 716, the seventh connecting bus bar 717, the first connecting bus bar 711, the second connecting bus bar 712, the third connecting bus bar 713, and the fourth connecting bus bar 714.

Each of the central parts (the first embedded part 711a to the seventh embedded part 717a) of the first connecting bus bar 711 to the seventh connecting bus bar 717 insert-molded in the base part 721 has an extension part 718, a first extension part 719a, and a second extension part 719b. The extension part 718 extends along the x-direction from the left face 721a toward the right face 721b. The first extension part 719a extends along the y-direction from the end of the extension part 718 on the left face 721a side toward the one end 710a side. The second extension part 719b extends along the y-direction from the end of the extension part 718 on the right face 721b side toward the other end 710b side.

As shown in FIGS. 3 and 4, the lengths of the extension parts 718 of the first embedded part 711a to the seventh embedded part 717a in the x-direction are the same. However, the lengths of the first extension parts 719a of the seven embedded parts in the y-direction are different. Similarly, the lengths of the second extension parts 719b of the seven embedded parts in the y-direction are also different. However, the total length of the first extension part 719a and the second extension part 719b in the y-direction is the same for all of the seven embedded parts.

The length of each of the seven first extension parts 719a in the y-direction decreases as the number given to the embedded part increases. In contrast, the length of each of the second extension parts 719b in the y-direction increases as the number given to the embedded part increases.

Further, with regard to the positions of the seven extension parts 718 in the y-direction, the larger the number given to the embedded part, the further the extension part from the front face 721c. In other words, the larger the number given to the embedded part, the closer the extension part 718 to the rear face 721d in the y-direction.

In the following, for simplification of the discussion, two embedded parts next to each other in the x-direction are referred to as a left embedded and a right embedded part. For example, when the left embedded part is the first embedded part 711a, the right embedded part would be the second embedded part 712a.

As shown in FIGS. 3 and 4, in the x-direction, the first extension part 719a of a left embedded part adjoins the first extension part 719a, the extension part 718, and the extension part 718-side segment of the second extension part 719b of the right embedded part. In the x-direction, the extension part 718-side segment of the first extension part 719a, the extension part 718, and the second extension part 719b of the left embedded part adjoin the second extension part 719b of the right embedded part.

In the y-direction, the extension part 718 of the left embedded part adjoins the extension part 718 of the right embedded part.

Operations and Effects

As described above, a left embedded part and a right embedded part adjoin each other in the x-direction and the y-direction. Further, a left embedded part and a right embedded part are integrally connected to each other by the material forming the base part 721 which exists between them.

With such configuration, the rigidity of the terminal block 720 is increased in the x-direction and the y-direction. This prevents displacement of the connecting bus bars integrally connected to the terminal block 720 in the x-direction and the y-direction due to vibration or thermal expansion. Changes in the relative positional relationship between the magnetoelectric conversion parts and the connecting bus bars provided in the terminal block 720 are prevented. Fluctuations in the measured magnetic field passing through the magnetoelectric conversion parts are suppressed. As a result, it is possible to prevent the current detection accuracy of the current sensor 730 from deteriorating.

Further, as compared with the configuration in which the rigidity of the terminal block 720 is enhanced by support members that are separate from the connecting bus bars, the number of components can be reduced.

The first extension parts 719a are aligned with the magnetoelectric conversion parts in the z-direction. One end 710a which extends integrally with the first extension part 719a in the same direction is welded to the midpoint terminal 330c of the switch module. On the other hand, the other end 710b which extends integrally with the second extension part 719b in the same direction is bolted to the outer bus bar.

The extension directions of the first extension part 719a and the extension part 718 are orthogonal to each other. The extension directions of the extension part 718 and the second extension part 719b are orthogonal to each other.

Thus, the shape of the first extension part 719a would not be distorted by the stress acting on the connecting bus bar when the other end 710b and the outer bus bar are bolted together. Changes in the relative positional relationship between the first extension part 719a and the magnetoelectric conversion part are prevented. As a result, fluctuations in the measured magnetic field passing through the magnetoelectric conversion parts are suppressed.

The first shield 741 to the seventh shield 747 are insert-molded in the terminal block 720 such that they are aligned in the x-direction.

As described above, the rigidity of the terminal block 720 in the x-direction and the y-direction is enhanced. This prevents displacement of the shields integrally connected to the terminal block 720 in the x-direction and the y-direction due to vibration or thermal expansion. Changes in the relative positional relationship between the magnetoelectric conversion parts and the shields provided in the terminal block 720 are prevented.

The resin cover 750 in which the first opposing shield 761 to the seventh opposing shield 767 are insert-molded such that they are aligned in the x-direction is provided on the terminal block 720. The magnetoelectric conversion parts and the embedded parts are arranged so as to face each other in the z-direction, and each pair is located between one shield and one opposing shield.

According to this configuration, the shields and the opposing shields suppress external noise from interfering with the magnetoelectric conversion parts. At the same time, the shields and the opposing shields regulate distribution of the magnetic field generated from the current flowing in the embedded parts.

Although a preferred embodiment of the present disclosure has been described above, the present disclosure is not limited to the above-described embodiment, and it can be modified in various ways without departing from the gist of the present disclosure.

First Modification

In the present embodiment, an example is shown in which the first extension parts 719a and the magnetoelectric conversion parts are aligned in the z-direction. However, alternatively, it is also possible to adopt a configuration in which the second extension parts 719b and the magnetoelectric conversion parts are aligned in the z-direction.

As described in connection with the present embodiment, one end 710a of the connection bus bar is joined to the midpoint terminal 330c of the switch module and the other end 710b is bolted to the outer bus bar. The outer bus bar is connected to the motor 400 via a wire harness.

Therefore, for example, if the switch module vibrates due to an electromagnetic force caused by the flow of current, the vibration is transmitted to the one end 710a (the first extension part 719a) of the connecting bus bar joined to the midpoint terminal 330c of the switch module. This vibration intends to reach the second extension part 719b via the extension part 718.

However, the extension directions of the first extension part 719a and the extension part 718 are orthogonal to each other, and the extension directions of the extension part 718 and the second extension part 719b are orthogonal to each other. Therefore, the transmission of vibration from the first extension part 719a to the extension part 718 is suppressed at the segment where they meet. The transmission of vibration from the extension part 718 to the second extension part 719b is suppressed at the segment where they meet.

Further, there is a risk that the vibration of the motor 400 is transmitted to the other ends 710b of the second connecting bus bar 712 to the seventh connecting bus bar 717. However, the outer bus bar connected to the other end 710b (the second extension part 719b) is connected to the motor 400 via a wire harness. Therefore, the transmission of vibration from the motor 400 to the second extension part 719b is suppressed at the wire harness.

Accordingly, vibration of the switch module or the motor 400 does not cause vibration of the second extension part 719b. Changes in the relative positional relationship between the second extension parts 719b and the magnetoelectric conversion parts aligned in the z-direction are prevented. Fluctuations in the magnetic field passing through the magnetoelectric conversion parts are suppressed, whereby deterioration in current detection accuracy is prevented.

Second Modification

It is also possible to adopt a configuration in which the extension parts 718 and the magnetoelectric conversion parts are aligned in the z-direction.

In this case, since the extension directions of the first extension parts 719a and the extension parts 718 are orthogonal to each other, it is possible to prevent the vibration generated in the switch module joined to the one end 710a from being transmitted to the extension part 718. Since the extension directions of the second extension parts 719b and the extension parts 718 are orthogonal to each other, it is possible to prevent the shape of the extension part 718 from being distorted by the stress acting on the connecting bus bar when the other end 710b is bolted to the outer bus bar. Thus, changes in the relative positional relationship between the extension parts 718 and the magnetoelectric conversion parts aligned in the z-direction are prevented.

Third Modification

In the present embodiment, an example in which the inverter 320 includes six switch modules, namely, the U-phase switch module 322 to the Z-phase switch module 327 has been discussed. However, it is also possible to adopt a configuration in which the inverter 320 has three switch modules, namely, a X-phase switch module 325 to a Z-phase switch module 327.

Fourth Modification

Figure 7:
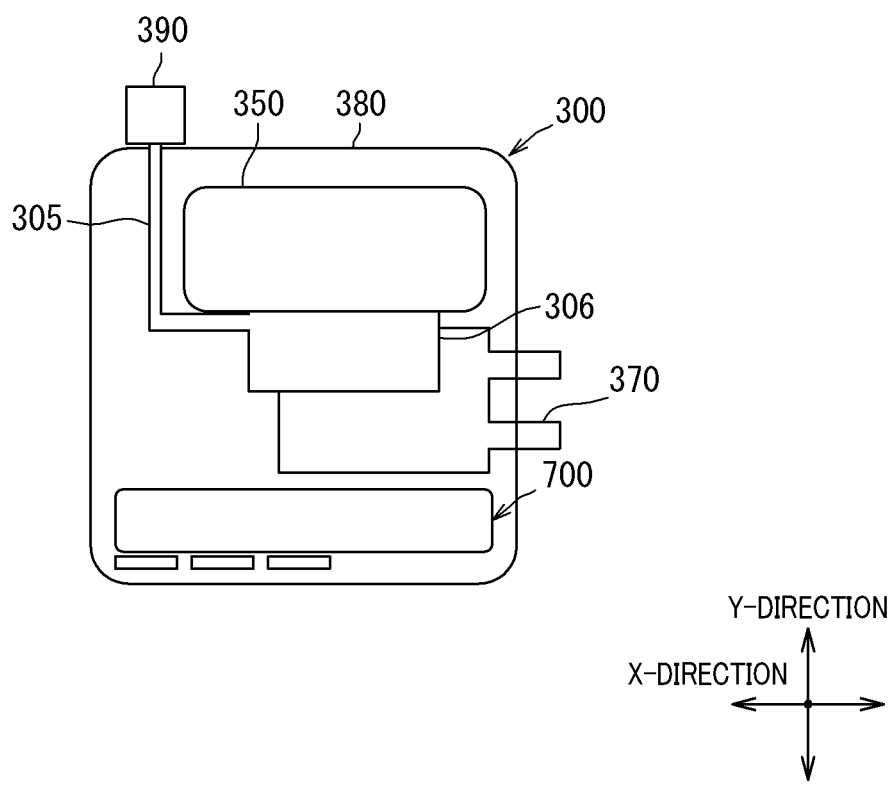
FIG. 7 is a schematic diagram of a modification to the power converter.
Figure 8:
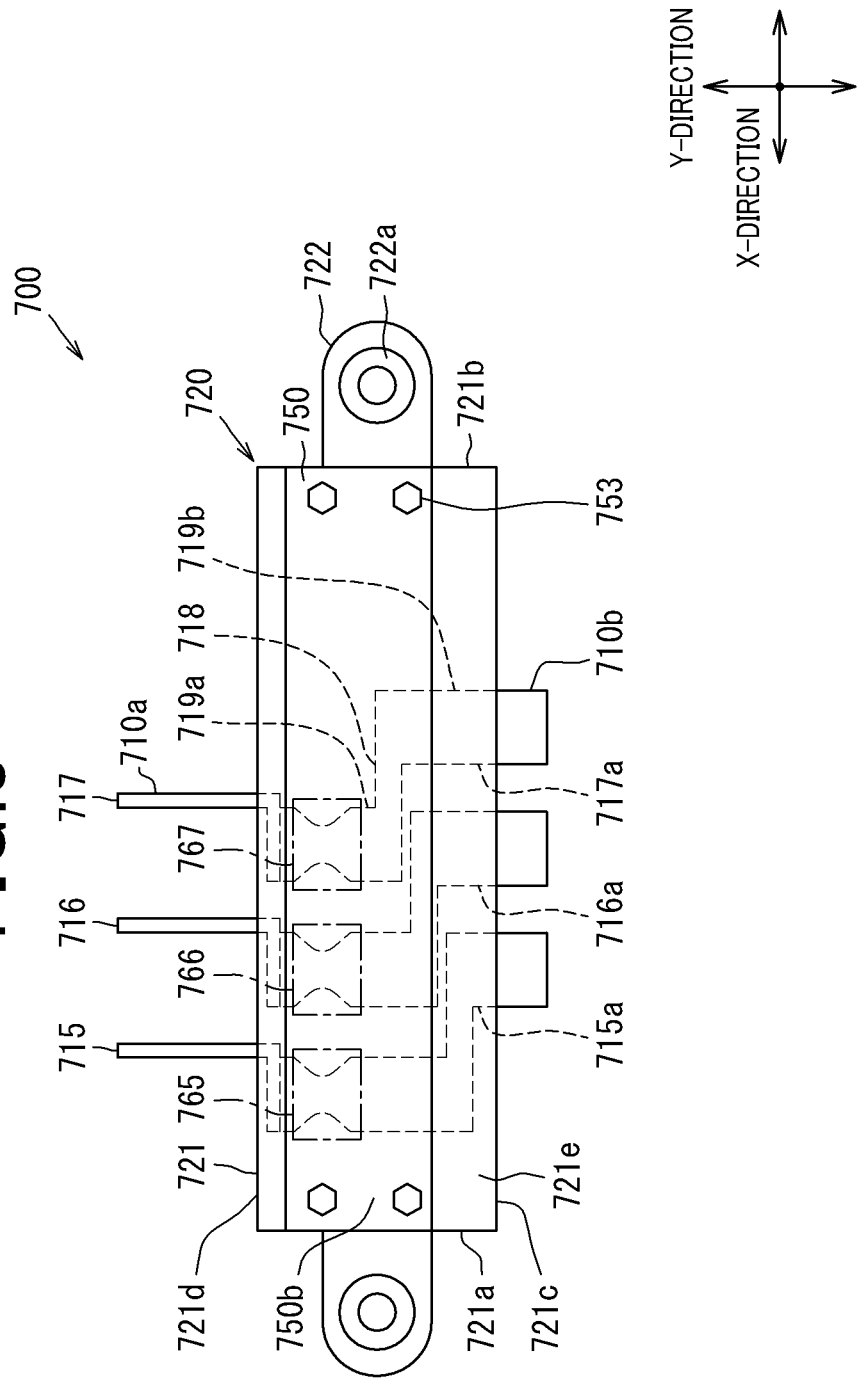
FIG. 8 is a top view of the sensor unit of the power converter shown FIG. 7.

In the present embodiment, an example has been shown in which the power converter 300 includes the converter 310 and the inverter 320. However, for example, as shown in FIG. 7, the power converter 300 may include only the inverter 320. In this case, for example, as shown in FIGS. 8 and 9, three connection bus bars are insert-molded in the terminal block 720.

Fifth Modification

In this embodiment, the shields 740 and the opposing shields 760 have the shape of a flat plate with a small thickness in the z-direction. However, the shape of the shields is not particularly limited. For example, each of the shields and the opposing shields may have a flat plate part with a small thickness in the z-direction and side plate parts extending in the z-direction from the two edges of the flat plate part in the x-direction. It is also possible to adopt a configuration in which the end faces of the side plate parts of the shields and opposing shields face each other in the z-direction so that each pair of the magnetoelectric conversion part and the embedded part is surrounded by the two shields. Furthermore, it is also possible to adopt a configuration in which the sensor unit 700 includes only one of the shields 740 and the opposing shields 760.

OTHER MODIFICATIONS

In the above-described embodiments, examples are shown in which the power converter 300 including the sensor unit 700 is applied to an on-board vehicle system 100 constituting a hybrid system. However, the application of the power converter 300 is not particularly limited to these examples. For example, a configuration in which the power converter 300 is applied to an on-board vehicle system of an electric vehicle can be adopted.

What is claimed is:

1. A sensor unit comprising:
a plurality of bus bars individually and respectively connected to a plurality of switch modules forming a part of a power conversion circuit;
an insulating resin case configured to integrally link the plurality of bus bars such that a part of each bus bar is embedded in the insulating resin case; and
a plurality of magnetoelectric conversion parts configured to detect currents flowing through the plurality of bus bars by detecting magnetic fields generated by flows of the currents through the plurality of bus bars, wherein
the plurality of bus bars have higher rigidity than the resin case,
the respective embedded parts of the plurality of bus bars embedded in the resin case are each adjoined and aligned in a first predefined axis direction with spaces therebetween,
the plurality of magnetoelectric conversion parts are positioned in the resin case such that each magnetoelectric conversion part of the plurality of magnetoelectric conversion parts faces a longitudinal face of a corresponding one of the embedded parts of the plurality of bus bars in a second predefined axis direction, which is orthogonal to and intersects with the first predefined axis direction,
each embedded part of the plurality of bus bars includes multiple extension parts respectively extending in the first predefined axis direction and a third predefined axis direction, and
the respective extension parts of any two embedded parts of the plurality of bus bars that are adjacent to each other in the first predefined axis direction adjoin each other in the third predefined axis direction, which is orthogonal to and intersects with both the first predefined axis direction and the second predefined axis direction, such that each extension part of each of the two embedded parts adjoin each other.

2. The sensor unit according to claim 1, wherein:
one end of each bus bar is connected to a terminal of one of the plurality of switch modules, and another end of the same bus bar is connected to an on-board equipment via a wire harness,
each embedded part of the plurality of bus bars includes, in addition to the extension part, a first extension part and a second extension part which extend in a direction different from a direction of the extension part,
the first extension part extends from the extension part toward the one end, and the second extension part extends from the extension part toward the other end, and
each magnetoelectric conversion part of the plurality of magnetoelectric conversion parts faces a corresponding one of the first extension parts in the second predefined axis direction.

3. The sensor unit according to claim 1, further comprising a plurality of shields embedded in the resin case such that the plurality of shields are aligned in the first predefined axis direction, the plurality of shields being configured to suppress external noise from interfering with the plurality of magnetoelectric conversion parts.

4. The sensor unit according to claim 3, further comprising:
an insulating resin cover fixed to the resin case, and
a plurality of opposing shields embedded in the resin cover such that the plurality of opposing shields are aligned in the first predefined axis direction with spaces therebetween, the plurality of opposing shields being configured to suppress external noise from interfering with the plurality of magnetoelectric conversion parts, wherein
in a state where the resin cover is fixed to the resin case, one of the plurality of magnetoelectric conversion parts and one of the respective embedded parts are located between one of the plurality of shields and one of the plurality of opposing shields.

* * * * *